United States Patent

Soma et al.

[11] Patent Number: 5,276,401
[45] Date of Patent: Jan. 4, 1994

[54] METHOD FOR DIAGNOSING AN INSULATION DETERIORATION OF AN ELECTRIC APPARATUS

[75] Inventors: Kenichiro Soma; Kazuo Kotani; Nobuju Takaoka, all of Ibaraki, Japan

[73] Assignee: Hitachi Cable, Ltd., Tokyo, Japan

[21] Appl. No.: 987,061

[22] Filed: Dec. 7, 1992

Related U.S. Application Data

[63] Continuation of Ser. No. 637,226, Jan. 3, 1991, abandoned.

[30] Foreign Application Priority Data

Jan. 9, 1990 [JP] Japan .................... 2-2186

[51] Int. Cl.$^5$ .................... G01R 27/26
[52] U.S. Cl. .................... 324/551; 324/544
[58] Field of Search .............. 324/539, 541, 543, 544, 324/551, 536, 557; 340/647

[56] References Cited

U.S. PATENT DOCUMENTS

| | | | |
|---|---|---|---|
| 3,178,640 | 4/1965 | Jaster et al. .................... | 324/544 |
| 4,721,916 | 1/1988 | Hanasawa et al. .................... | 324/544 |
| 4,766,386 | 8/1988 | Oliver et al. .................... | 324/527 |
| 4,980,645 | 12/1990 | Soma et al. .................... | 324/541 |

FOREIGN PATENT DOCUMENTS

| | | | |
|---|---|---|---|
| 0147357 | 11/1980 | Japan .................... | 324/551 |
| 59-202073 | 11/1984 | Japan . | |
| 0055571 | 3/1987 | Japan .................... | 324/551 |
| 0281074 | 11/1988 | Japan .................... | 324/551 |
| 35281 | 2/1989 | Japan .................... | 324/544 |

OTHER PUBLICATIONS

IEEE Transactions On Power Delivery, vol. 4, No. 2, Apr. 1989, New York A. Nakajima et al.: "Development Of A Hot-Line Diagnostic Method For Xlpe Cables And Measurement Results".

IEEE Transactions On Power Delivery, vol. 2, No. 1, Jan. 1987, New York H. Oonishi et al.: "Development Of A New Diagnostic Method For Hot-Line XLPE Cables With Water Trees".

*Primary Examiner*—Kenneth A. Wieder
*Assistant Examiner*—Maura K. Regan
*Attorney, Agent, or Firm*—Helfgott & Karas

[57] ABSTRACT

A charging current flows through an insulation for insulating two conductors of an electric apparatus by applying an alternate current voltage thereto. A direct current component of the charging current is detected, and is amplified by biasing a direct current voltage to the alternate current voltage. An insulation deterioration of the electric apparatus is determined by an absolute value of the amplified direct current component.

2 Claims, 3 Drawing Sheets

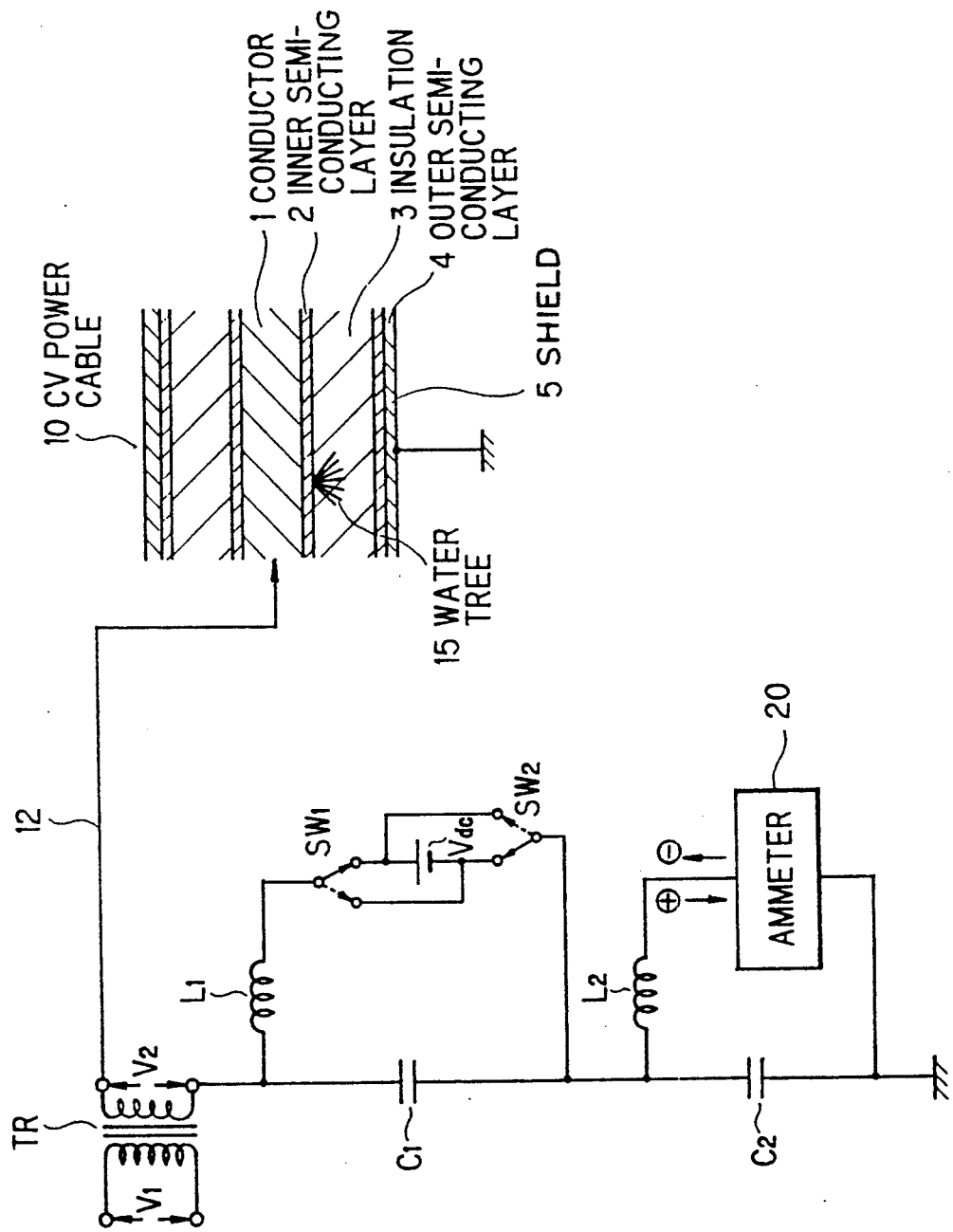

METHOD FOR DIAGNOSING AN INSULATION DETERIORATION OF AN ELECTRIC APPARATUS

This is a continuation of application Ser. No. 637,226, filed Jan. 3, 1991, now abandoned.

FIELD OF THE INVENTION

The invention relates to a method for diagnosing an insulation deterioration of an electric apparatus, and more particularly to a method for diagnosing an insulation deterioration of a power cable such as a cross-linked polyethylene insulated cable, in which an insulation deterioration of the cable is detected under a state that a rated line voltage is applied to a power cable system.

BACKGROUND OF THE INVENTION

It has been clarified in the art that an insulation deterioration of a power cable such as a cross-linked polyethylene insulated cable (hereinafter defined CV cable) is mainly caused by the absorption of moisture into the solid insulation material to which a rated line voltage is applied. In the circumstance, water tree is induced in the insulation material, and is then developed therein to finally result in a breakdown of the power cable. Therefore, a method for detecting the insulation deterioration including water tree is required to be established, thereby avoiding the breakdown of an insulation material for a power cable in advance.

A first type of a conventional method for diagnosing an insulation deterioration of a power cable comprises a step of measuring an insulation resistance of the power cable by use of a megger.

In this method, however, there is a disadvantage in that a cable having an insulation deterioration immediately causing the breakdown can not be detected. Therefore, this method is not a sufficiently satisfactory method for dianosing an insulation deterioration of a power cable.

A second type of a conventional method for diagnosing an insulation deterioration of a power cable comprises steps of applying a direct current (DC) high voltage to an insulation of the power cable, and detecting leakage direct current flowing through the insulation, so that the insulation deterioration is diagnosed dependent on a level of the leakage direct current.

In this method, however, there is a disadvantage in that a power cable to which a rated load voltage is applied to supply electric power to actual loads is not diagnosed, because the aforementioned DC voltage of a level which is determined in diagnosis conditions is applied to the power cable. Even worse, there is a further disadvatage in that the insulation deterioration is badly promoted to result in the breakdown of the power cable in some case dependent on a degree of the insulation deterioration, because the diagnosing DC high voltage is applied to the power cable.

In view of these situations, another method of diagnosing an insulation deterioration of a power cable has been proposed to detect water trees generated in a deteriorated insulation of a 6 kV power distribution CV cable. This method comprises steps of detecting a direct current component of a minute level included in a charging current of the CV cable in a state that a 6 kV power distribution voltage is applied to the CV cable to supply electric power to loads of a power distribution system, and diagnosing whether an insulation deterioration has occured in the insulation by checking value and waveform of the direct current component. The detection of the direct current component is carried out by use of a ground wire of the CV cable, through which the direct current component flows.

However, this proposed method is not applied to a CV cable power distribution system having a line voltage of more than 22 KV, because the CV cable is connected to ground at multi-points. Even if the CV cable is not connected to ground at the multi-points, the detection of the direct current component is very hard at an installation site of the CV cable, because much noise is detected to lower a S/N ratio.

SUMMARY OF THE INVENTION

Accordingly, it is an object of this invention to provide a method for diagnosing an insulation deterioration of an electric apparatus, especially, a CV cable of more than 22 KV, in which the insulation deterioration caused by water trees is precisely detected.

According to this invention, a method for diagnosing an insulation deterioration of an electric apparatus, comprises steps of:

applying an AC voltage across two conducting members insulated by an insulation to detect a direct current component flowing through the insulation;

amplifying the direct current component by biasing a DC voltage to the AC voltage to provide an amplified direct current component; and determining the insulation deterioration by an absolute value of the amplified direct current component.

A polarity and a level of the DC voltage to be biased to the AC voltage is determined by a polarity and a level of the direct current component flowing through the insulation only by applying the AC voltage. Consequently, no breakdown of the insulation occurs during the diagnosis procedure of the insulation deterioration. This invention is advantageously applied to the diagnosis of an insulation deterioration for a CV cable of more than 22 KV. In this application, an AC voltage is applied across a conductor and a metal shield which is connected to ground to detect a direct current component flowing through a cross-linked polyethylene insulation.

BRIEF DESCRIPTION OF THE DRAWINGS

This invention will be explained in more detail in conjunction with appended drawings, wherein:

FIG. 1 is a circuitry diagram showing a method for diagnosing an insulation deterioration of a CV power cable in a preferred embodiment according to the invention;

DESCRIPTION OF THE PREFERRED EMBODIMENTS

Figure 2A:
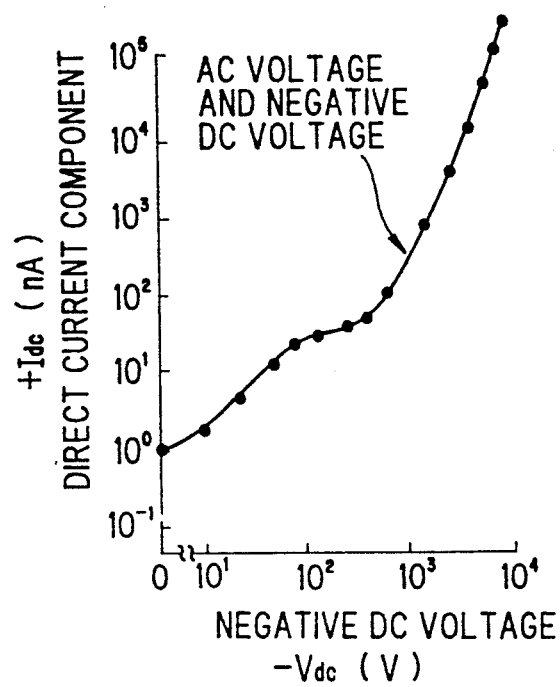
FIGS. 2A and 2B are graphs explaining a relation between an amplified direct current component and a bias DC voltage.

FIG. 1 shows a method for diagnosing an insulation deterioration of a CV cable 10 having a water tree 15 in a cross-linked polyethylene insulation 3 in the preferred embodiment according to the invention. A circuit for detecting a direct current component flowing through the insulation 3 comprises a transformer TR for applying an AC voltage $V_2$ which is obtained from an AC voltage $V_1$ through a lead 12 to a conductor 1 of the CV cable 10, capacitances $C_1$ and $C_2$ provided between a secondary winding of the transformer TR and ground, a DC voltage biasing circuit including a blocking coil $L_1$, a DC power supply Vdc, and switches $SW_1$ and $SW_2$ for changing a polarity of a bias DC voltage, and a direct current component detecting circuit including a blocking coil $L_2$ and an ammeter 20. The CV cable 10 comprises a conductor 1, an inner semiconductive layer 2 provided on the conductor 1, the cross-linked polyethylene insulation 3, an outer semiconducting layer 4 provided on the insulation 3, and a metal shield 5 connected to ground. A polyvinylchloride anti-corrosion layer provided on the metal shield 5 is not shown in FIG. 1. Here, it is assumed that a polarity of a direct current component is positive, when the direct current component flows from the metal shield 5 to the conductor 1. The polarity is shown in FIG. 1 by the symbols $\oplus$ and $\ominus$.

In operation, an AC voltage obtained at secondary terminals of the transformer TR is applied across the conductor 1 and the metal shield 5, so that a charging current flows through the insulation 3. A direct current component which is included in the charging current is detected by the ammeter 20.

If the polarity of the direct current component is positive, the switches $SW_1$ and $SW_2$ are turned on, as shown by dotted lines. Thus, the positive direct current is amplified, and is detected by the ammeter 20.

On the other hand, if the polarity of the direct current component is negative, the switches $SW_1$, and $SW_2$ are turned on, as shown by solid lines. Thus, the negative direct current component is amplified, and is detected by the ammeter 20.

FIG. 2A shows an amplified direct current component Idc, when a negative bias voltage $-Vdc$ is applied to the conductor 1, that is, the switches $SW_1$ and $SW_2$ are turned on by the dotted lines. The direct current component Idc increases with a relatively complicated motion, as the negative bias voltage $-Vdc$ increases in its absolute value. When the negative bias voltage $-Vdc$ is $-1000$ V, the direct current component Idc is amplified by two to three figures, as compared to a direct current component flowing through the insulation 3 only by the application of an AC voltage.

Figure 2B:
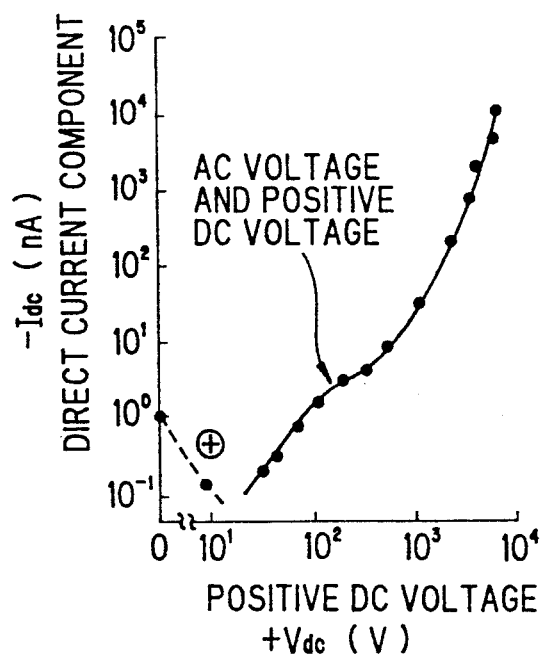

FIG. 2B shows an amplified direct current component $-Idc$, when a positive bias voltage Vdc is applied to the conductor 1, that is, the switches $SW_1$ and $SW_2$ are turned on by the solid lines. At first, the positive direct current component $\oplus$ decreases, as the positive bias voltage Vdc increases from zero to approximately $10^1$ V, and the positive direct current component $\oplus$ becomes zero at a positive bias voltage $+Vdc$. Then, a negative direct current component $-Idc$ begins to flow through the insulation 3, as the positive bias voltage Vdc further increases, and the negative direct current component $-Idc$ increases in its absolute value in proportional to the increase of the positive bias voltage Vdc.

Figure 3:
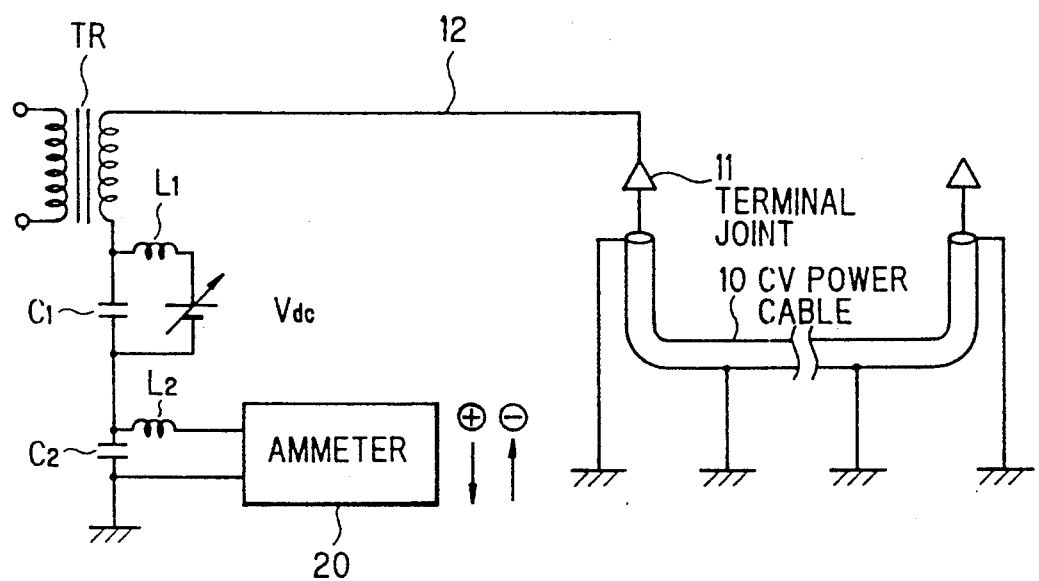
FIG. 3 is an explanatory diagram illustrating the method of the preferred embodiment applied to a CV cable system.

FIG. 3 shows a method for diagnosing an insulation deterioration of a CV cable 10 which is connected at multi-points to ground. In this method, a conductor of the CV cable 10 is connected through a lead 12 to a transformer TR by a terminal joint 11. The transformer TR is connected through serial capacitances $C_1$ and $C_2$ to ground, and a DC bias voltage applying circuit including a blocking coil $L_1$ and a DC power supply Vdc and a direct current component detecting circuit including a choke coil $L_2$ and an ammeter 20 are connected in parallel to the capacitances $C_1$ and $C_2$, respectively.

The detection of a direct current component and an amplified direct current component is carried out on the CV cable 10 which has been installed at an installation site in the same manner as the operation in FIG. 1. Then, the CV cable is removed from the installation site, and is subject to an AC voltage breakdown test. The length of water trees found in an insulation of the removed CV cable is measured. The results are shown in TABLE 1.

TABLE 1

| | | AT INSTALLATION SITE | | | | REMOVED | |
|---|---|---|---|---|---|---|---|
| | | APPLYING AC VOLTAGE WITHOUT DC BIAS VOLTAGE | | APPLYING AC VOLTAGE WITH DC BIAS VOLTAGE | | INSULATION RESISTANCE BY 1000 V-MEGGER | |
| SAMPLE NO. | PHASE | AC VOLTAGE | DC COMPONENT | DC BIAS VOLTAGE | AMPLIFIED DC COMPONENT | | AC BREAKDOWN VOLTAGE | WATER TREE LENGTH |
| 1 | RED | 12.7 kV | +0.1 nA> | −1 kV | +0.1 nA> | 2000M Ω< | 80 kV | NOT MEASURED |
| | WHITE | 12.7 kV | +0.1 nA> | −1 kV | +0.1 nA> | 2000M Ω< | 90 kV | NOT MEASURED |
| | BLUE | 12.7 kV | +0.4 nA | −1 kV | +33 nA | 2000M Ω< | 50 kV | 4.5 mm |
| 2 | RED | 12.7 kV | −0.1 nA> | +1 kV | −0.1 nA> | 2000M Ω< | 110 kV | NOT MEASURED |
| | WHITE | 12.7 kV | −0.1 nA> | +1 kV | −0.1 nA> | 2000M Ω< | 100 kV | NOT MEASURED |
| | BLUE | 12.7 kV | −3 nA | +1 kV | −2500 nA | 2000M Ω< | 40 kV | 5.3 mm |
| 3 | RED | 12.7 kV | −1300 nA | +0.1 kV | −73000 nA | 110M Ω | 25 kV | 6.3 mm |
| | WHITE | 12.7 kV | +0.1 nA> | −1 kV | +0.1 nA> | 2000M Ω< | 70 kV | 0.5 mm |
| | BLUE | 12.7 kV | +0.1 nA> | −1 kV | +0.1 nA> | 2000M Ω< | 75 kV | 0.5 mm |
| 4 | RED | 12.7 kV | +0.1 nA> | −1 kV | +0.1 nA> | 2000M Ω< | 90 kV | NOT MEASURED |
| | WHITE | 12.7 kV | −24 nA | +0.5 kV | −19000 nA | 200M Ω | 35 kV | 5.9 mm |
| | BLUE | 12.7 kV | +0.1 nA> | −1 kV | +0.1 nA> | 2000M Ω< | 80 kV | NOT MEASURED |

As understood from TABLE 1, when a direct current component of more than 0.4 nA flows through the insulation of the CV cable 10, in a state that an AC voltage of 12.7 KV is applied to the CV cable 10 by the transformer TR a predetermined length of water tree is found in the insulation of the CV cable 10. The length of water tree is proportional to an absolute value of an amplified direct component, and an AC breakdown voltage is lowered proportionally to the absolute value. When the AC breakdown voltage is more than 80 KV, no water tree is found in an aperture of breakdown.

Accordingly, a CV cable having an insulation deteriorated by water tree can be precisely detected by measuring a direct current component flowing at the time of an AC voltage application and an amplified direct current component flowing at the time of an AC voltage and DC bias voltage applications.

This invention is not applied to a CV cable, but other cables such as an oil filled (OF) cable, a rubber insulated cable, etc., a normal joint, a terminal joint, etc. of power cable, and electric machines such as a transformer, an electric motor, an arrester, etc.

Thus, the breakdown of an insulation of such electric machines is avoided, so that an electric machine having an insulation deteriorated by water tree is replaced in advance of the breakdown by a new one. Accordingly, the stop of electric power service causing a serious problem is precisely avoided.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for diagnosing an insulation deterioration of an electric power cable, comprising the steps of:
    applying an AC voltage across a conductor and a metal shield of said electric power cable insulated by an insulation of said electric power cable to detect a direct current component flowing through said insulation;
    amplifying said direct current component by biasing a DC voltage to said AC voltage to provide an amplified direct current component; and
    determining said insulation deterioration by an absolute value of said amplified current component, said insulation deterioration being caused by absorption of moisture to generate water tree,
    wherein a polarity of said DC voltage depends on a polarity of said direct current component.

2. A method for diagnosing an insulation deterioration of an electric power cable, according to claim 1 wherein:
    said insulation is a cross-linked polyethylene.

* * * * *